(12) United States Patent
Huang

(10) Patent No.: US 7,488,958 B2
(45) Date of Patent: Feb. 10, 2009

(54) HIGH CONDUCTANCE ION SOURCE

(75) Inventor: Yongzhang Huang, Hamilton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 504 days.

(21) Appl. No.: 11/074,435

(22) Filed: Mar. 8, 2005

(65) Prior Publication Data
US 2006/0219938 A1    Oct. 5, 2006

(51) Int. Cl.
*G21K 5/10*    (2006.01)
(52) U.S. Cl. ............................ 250/492.21; 250/492.1
(58) Field of Classification Search .. 250/423 R–423 F, 250/492.1–492.3
See application file for complete search history.

(56) References Cited

U.S. PATENT DOCUMENTS

| | | | |
|---|---|---|---|
| 5,554,854 A | 9/1996 | Blake | |
| 5,554,857 A | 9/1996 | Benveniste | |
| 5,661,308 A | 8/1997 | Benveniste et al. | |
| 5,943,594 A * | 8/1999 | Bailey et al. | 438/514 |
| 6,060,718 A * | 5/2000 | Brailove et al. | 250/505.1 |
| 6,355,933 B1 | 3/2002 | Tripsas et al. | |
| 6,664,548 B2 | 12/2003 | Benveniste et al. | |
| 6,768,121 B2 | 7/2004 | Horsky et al. | |
| 6,791,097 B2 * | 9/2004 | Scheuer et al. | 250/492.21 |
| 6,833,710 B2 | 12/2004 | Benveniste | |

FOREIGN PATENT DOCUMENTS

| | | |
|---|---|---|
| JP | 62180944 | 8/1987 |
| JP | 03064462 | 3/1991 |
| JP | 08129983 | 5/1996 |
| JP | 2000223039 | 8/2000 |
| WO | WO 01/43157 A1 | 6/2001 |

OTHER PUBLICATIONS

"Ion Implantation for Silicon Device Manufacturing: A Vacuum Perspective", Michael I. Current, XP000620568, 1996 American Vacuum Society, pp. 1115-1123.
International Search Report, Int'l Application No. PCT/US2006/007874, Int'l Filing Date Mar. 3, 2006, 3 pgs.

* cited by examiner

*Primary Examiner*—Jack I Berman
*Assistant Examiner*—Andrew Smyth
(74) *Attorney, Agent, or Firm*—Eschweiler & Associates, LLC

(57) ABSTRACT

A system, apparatus, and method for changing source gases used for ion implantation is provided. A source chamber has a housing having one or more sidewalls and an extraction plate, wherein the one or more sidewalls and the extraction plate enclose an interior region of the source chamber. One or more inlets provide a fluid communication between one or more ignitable material sources and the interior region. An extraction aperture in the extraction plate provides a fluid communication between the interior region of the source chamber and a beam path region external to the source chamber. One or more diffusion apertures in the one or more sidewalls of the housing further provide a fluid communication between the interior region and a diffusion region external to the ion source chamber, wherein deposited ions are operable to diffuse out of the source chamber through the diffusion apertures.

24 Claims, 7 Drawing Sheets

HIGH CONDUCTANCE ION SOURCE

FIELD OF THE INVENTION

The present invention relates generally to ion implantation systems, and more specifically to a system, apparatus, and method for changing source gases used for ion implantation.

BACKGROUND OF THE INVENTION

In the manufacture of semiconductor devices and other products, ion implantation systems are used to impart impurities, known as dopant elements, into semiconductor wafers, display panels, or other work pieces. Typical ion implantation systems or ion implanters treat a work piece with an ion beam in order to produce n- or p-type doped regions, or to form passivation layers in the work piece. When used for doping semiconductors, the ion implantation system injects a selected ion species to produce the desired extrinsic material. Typically, dopant atoms or molecules are ionized and isolated, sometimes accelerated or decelerated, formed into a beam, and implanted into a wafer. The dopant ions physically bombard and enter the surface of the wafer, and subsequently come to rest below the surface.

A typical ion implantation system is generally a collection of sophisticated subsystems, wherein each subsystem performs a specific action on the dopant ions. Dopant elements can be introduced in gas form (e.g., a process gas) or in a solid form that is subsequently vaporized, wherein the dopant elements are positioned inside an ionization chamber and ionized by a suitable ionization process. For example, the ionization chamber is maintained at a low pressure (e.g., a vacuum), wherein a filament is located within the chamber and heated to a point where electrons are created from the filament source. Negatively-charged electrons from the filament source are then attracted to an oppositely-charged anode within the chamber, wherein during the travel from the filament to the anode, the electrons collide with the dopant source elements (e.g., molecules or atoms) and create a plurality of positively charged ions from the source elements. The positively charged ions are subsequently "extracted" from the chamber through an extraction slit via an extraction electrode, wherein the ions are generally directed along an ion beam path toward the wafer.

Typically, a single ion implantation system is utilized to implant several differing dopant ion species into respective batches of wafers, wherein a change in species (e.g., a change from a first species or process gas to a second species or process gas) is necessitated in order to perform the specific ion implantations. One typical change in species is a change from a boron-containing process gas (which produces a p-type implant) to a phosphorus-containing process gas (which produces an n-type implant). One drawback to using a single ion implantation system for implanting various species of ions, however, is that such a change in process species can be quite time consuming, since ions from the first process gas are typically deposited onto internal walls of the ionization chamber, and such deposited materials can adversely affect subsequent implantations using other ion species. For example, upon changing from the first species to the second species, deposited ions of the first species that are attached to the internal walls of the ionization chamber are typically sputtered off by ions of the second species and subsequently exit the chamber through the extraction slit, thus contaminating the desired second species ion beam with ions from the first species. Furthermore, the sputtered first species can affect the ionization of the second species, and as a result, the extracted second species will typically require a substantially long amount of time to stabilize. Conventionally, for some specific species transitions, such as a transition from boron species to phosphorus species, in order to clear the ionization chamber of the previous species, the system is "transitioned" for a period on the order of thirty minutes or longer, wherein the desired species is used to clear the chamber of the previous species. Accordingly, at the end of transition period, ions of the previous species are generally insignificant in the resultant ion beam.

Long transition periods, however, can adversely affect the ion implantation process. For example, long transition times can affect auto-tune times for the implanter, as well as the stability and productivity of the ion implanter. Also, during the transition period, energy and process species are generally wasted while the system purges the previous species from the ionization chamber. Accordingly, a need currently exists for a more efficient ion implantation system and apparatus, wherein a speed in changing from one species to another can be significantly increased.

SUMMARY OF THE INVENTION

Accordingly, the present invention overcomes the limitations of the prior art by providing a system, apparatus, and method for efficiently changing source gases or species used in ion implantation. Consequently, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward an ion source chamber for an ion implantation system, wherein the ion source chamber can be transitioned from one ion source material to another ion source material in an efficient and timely manner. The ion source chamber accomplishes this by providing one or more diffusion apertures associated with the ion source chamber, wherein materials deposited within the ion source chamber from a first ion source material can diffuse through the one or more diffusion apertures when a second ion source material is ionized within the ion source chamber.

According to one exemplary aspect of the invention, the ion source chamber comprises a housing having one or more sidewalls, wherein an extraction plate is further associated with the housing. The extraction plate, in conjunction with the one or more sidewalls, generally encloses an interior region of the ion source chamber. The extraction plate further comprises an extraction aperture, wherein ions from within the interior region of the ion source chamber are generally extracted there through, thus forming an ion beam. One or more inlets are further associated with the housing, wherein the one or more inlets provide a fluid communication between one or more ignitable material sources and the interior region of the ion source chamber. According to one example, an n-type first source material and a p-type second source material are operable to be introduced into the ion source chamber via the one or more inlets.

According to another exemplary aspect of the invention, one or more diffusion apertures are further associated with the housing, wherein the one or more diffusion apertures provide a fluid communication between the interior region of the housing and a diffusion region external to the ion source chamber. One or more of the one or more sidewalls, for example, comprise the one or more diffusion apertures therein, wherein a fluid conductance of the first source material and/or second source material from the interior region of the ion source chamber to a region exterior to the ion source chamber is significantly increased, therein providing an efficient and rapid transition between ion source materials.

In another example, the one or more apertures comprise one or more slots in a sidewall that is diametrically opposite the extraction plate, wherein an area of the one or more slots measured along a plane of the sidewall is sufficient to provide an optimal fluid conductance of the first and/or second ignitable material exiting the ion source chamber.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
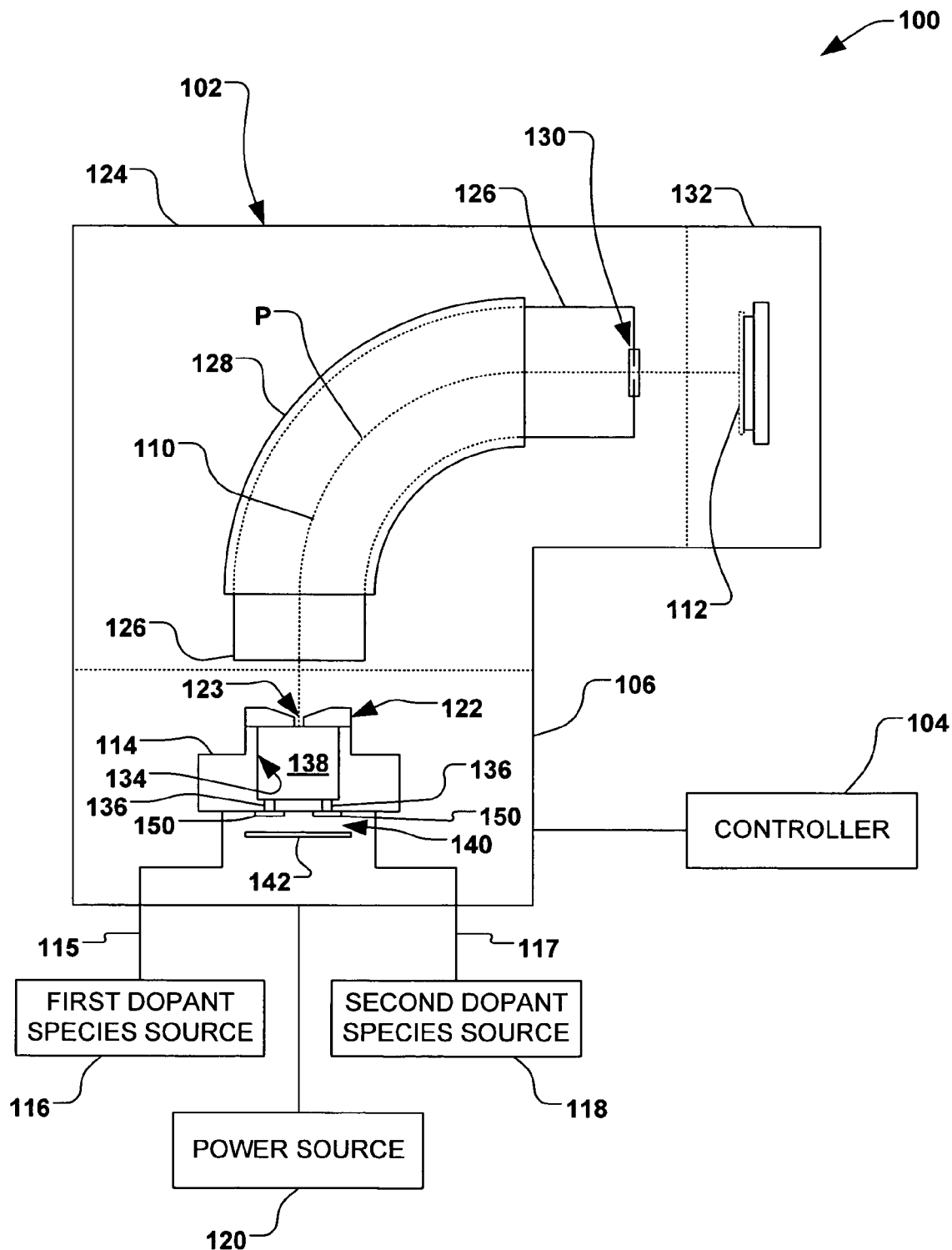
FIG. 1 illustrates a system-level view of an exemplary ion implantation system in accordance with one aspect of the present invention.

The present invention is directed generally towards an improved ion source chamber apparatus, ion implantation system, and method for changing ionization species used in ion implantation. More particularly, the apparatus, system, and method provide for an efficient and rapid change of source gases utilized in the ion implantation system. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Referring now to the figures, FIG. 1 illustrates a simplified exemplary ion implantation system 100, wherein the ion implantation system is suitable for implementing one or more aspects of the present invention. It should be noted that the ion implantation system 100 depicted in FIG. 1 is provided for illustrative purposes and is not intended to include all aspects, components, and features of an ion implantation system. Instead, the exemplary ion implantation system 100 is depicted so as to facilitate a further understanding of the present invention.

The ion implantation system 100, for example, comprises an ion implantation apparatus 102 (also referred to as an ion implanter) operably coupled to a controller 104. The controller 104, for example, is operable to substantially control an operation of the ion implantation apparatus 102. The ion implantation apparatus 102, for example, comprises an ion source assembly 106 for producing a quantity of ions operable to travel along an ion beam path P, thus defining an ion beam 110 for implantation of the ions to a work piece 112 (e.g., a semiconductor wafer, display panel, etc.). The ion source assembly 106, for example, comprises an ion source chamber 114 (e.g., a plasma chamber or arc chamber), wherein positively charged ions (not shown) are generated from a first dopant species 115 supplied by a first dopant species source 116 or a second dopant species 117 supplied by a second dopant species source 118. The positively charged ions are generally formed within the ion source chamber 114 by an application of power thereto from a power source 120. The first dopant species 115 and second dopant species 117 may comprise one or more source materials such as one or more of ignitable dopant gases, vaporized solid source materials, and/or other dopant species that have been previously vaporized. For an n-type implantation to the work piece 112, for example, the source materials may comprise boron, gallium or indium. For a p-type implantation, the source materials may comprise arsenic, phosphorus, or antimony.

The ion source assembly 106 further comprises an extraction assembly 122 associated therewith, wherein charged ions are extracted through an extraction slit 123 in the ion source chamber 114 via an application of an extraction voltage to the extraction assembly. A beam line assembly 124 is further provided downstream of the ion source assembly 106, wherein the beam line assembly generally receives the charged ions. The beam line assembly 124, for example, comprises a beam guide 126, a mass analyzer 128, and a resolving aperture 130, wherein the beam line assembly is operable to form and shape the ion beam 110.

The mass analyzer 128, for example, further comprises a field generating component, such as a magnet (not shown), wherein the mass analyzer generally provides a magnetic field across the ion beam 110, thus deflecting ions from the ion beam at varying trajectories according to a charge to mass ratio of the ions. For example, ions traveling through the magnetic field experience a force that directs individual ions of a desired charge to mass ratio along the beam path P and deflects ions of undesired charge to mass ratios away from the beam path. Once through the mass analyzer 128, the ion beam 110 is directed though the resolving aperture 130, wherein the ion beam is selected for implantation into the work piece 112 positioned within an end station 132.

In accordance with one exemplary aspect of the present invention, upon an operation of the ion implantation system 100 to implant ions into the work piece 112, the dopant species (e.g., the first dopant species 115 or second dopant species 117) will have a tendency to deposit (e.g., sputter) onto internal surfaces 134 of the ion source chamber 114. Accordingly, when changing between differing dopant species, such as switching from the first dopant species 115 to the second dopant species 117, a transition period is provided (e.g., a predetermined amount of time during which the ion implantation system 100 produces the ion beam 110 using the second dopant species) in order to allow the deposited materials associated with the first dopant species to be sputtered away from the internal surfaces 134 of the ion source chamber 114 by the second dopant species. After the transition period elapses, the resultant ion beam 110 is generally operable to impart the desired characteristics associated with the second species 117 into the work piece 112. Such a transition period is well known in the art, and is typically utilized to "purge" or "clear" conventional ion source chambers by expelling the sputtered first dopant species 115 through the extraction slit 123.

The present invention advantageously shortens conventional transition periods by further providing one or more diffusion apertures 136 in the ion source chamber 114, therein increasing a fluid conductance (e.g., an ability to flow) of the associated dopant species from an interior region 138 of the ion source chamber to a diffusion region 140 external to the ion source chamber. Providing such a high conductance ion source chamber 114 generally allows the deposited materials of the previous dopant species to exit the ion source chamber more rapidly, wherein the deposited materials advantageously diffuse through the one or more diffusion apertures 136, as well as exiting via the extraction slit 123. Such a diffusion generally allows for faster changes between particular dopant species, such as a change from the first dopant species 115 comprising boron trifluoride ($BF_3$) to the second dopant species 117 comprising phosphate ($PH_3$), as well as increases both stability and auto-tune times for the ion implantation system 100.

Figure 2:
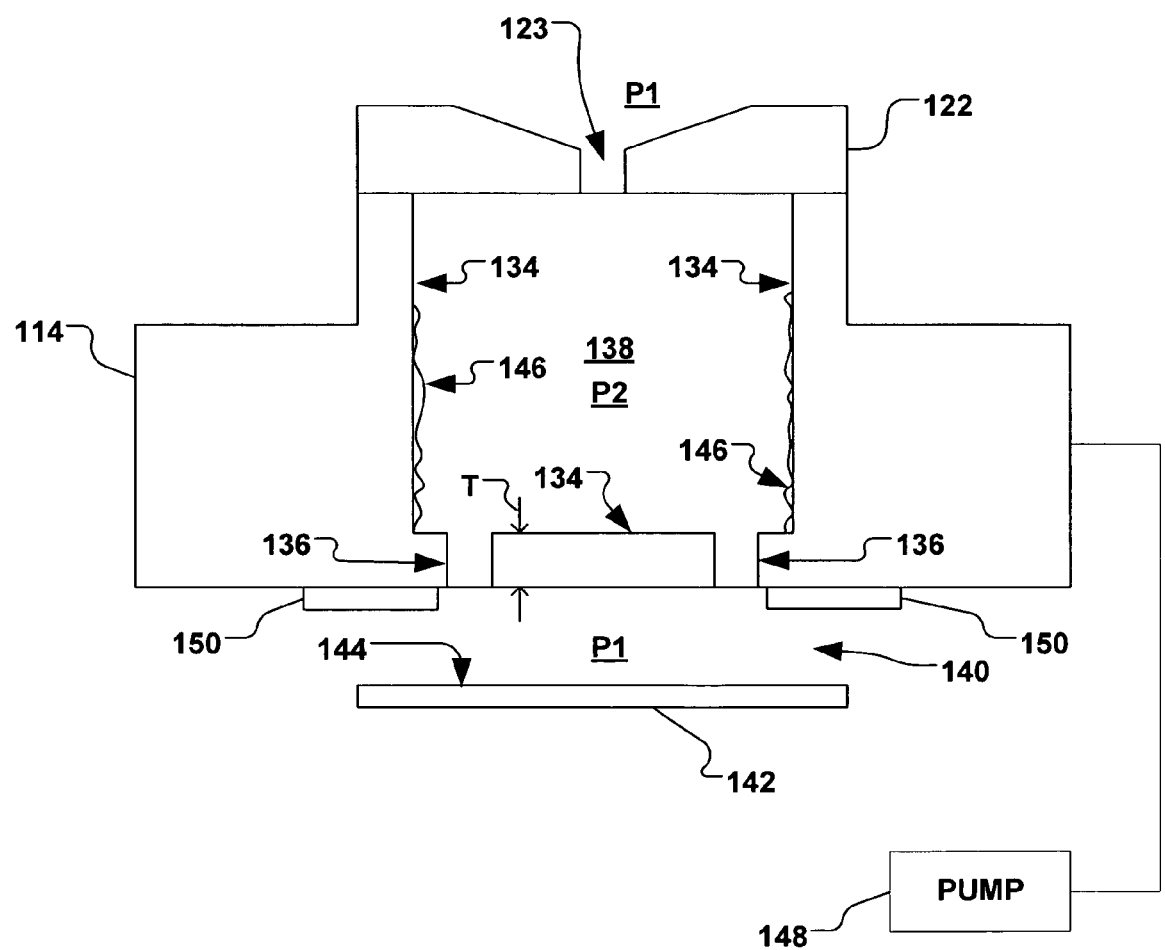
FIG. 2 is a schematic of an exemplary ion source chamber according to another aspect of the present invention.

FIG. 2 illustrates a simplified schematic of the exemplary ion source chamber 114 of FIG. 1, wherein several exemplary aspects of the present invention are further presented. The ion source chamber 114 of FIG. 2, for example, comprises the one or more diffusion apertures 136 therein, wherein the interior region 138 of the ion source chamber is in fluid communication with the diffusion region 140 via the one or more diffusion apertures. In the present example, a wall 142 generally resides within the diffusion region 140, wherein the wall generally defines a surface 144.

In one example, a number of n-type ion implantations can be repeatedly performed using the ion implantation system 100 of FIG. 1, wherein the first dopant species 115 is utilized for the ion implantation, and a subsequent change to a p-type implantation is desired using the second dopant species 117. The repeated ion implantations using the first dopant species 115, however, has deposited n-type material 146 onto the internal surfaces 134 of the ion source chamber 114 of FIG. 2. Accordingly, a transition period is provided, wherein the deposited material 146 associated with the first dopant species 115 is generally removed from the ion source chamber 114 via the p-type second dopant species 117, and wherein the system 100 of FIG. 1 is stabilized prior to implanting ions into the wafer 112 with the p-type second dopant species. In the present example, FIG. 2 further illustrates a pump 148 that is utilized to facilitate the transition between the first dopant species 115 and the second dopant species 117 of FIG. 1, as well as to provide a substantial vacuum pressure within the ion source chamber 114. Furthermore, in the present example, the first dopant species 115 comprises gaseous boron trifluoride ($BF_3$), and the second dopant species 117 comprises gaseous phosphate ($PH_3$). Thus, the deposited material 146 of FIG. 2 generally comprises n-type boron atoms.

A pumping throughput S (e.g., an amount of each dopant species being pumped through the ion source chamber 114) is generally defined by the conductance C of the dopant species being pumped through the one or more apertures 136 and a partial pressure differential of each dopant species between the interior region 138 and the diffusion region 140 of the ion source chamber. Accordingly, $$S = C*(P_2 - P_1) \quad (1)$$

for each dopant species (e.g., for each of the first dopant species 115 and the second dopant species 117 of FIG. 1), wherein the conductance C is proportional to an area of the one or more diffusion apertures 136 of FIG. 2, $P_1$ is the partial pressure of the associated dopant species external to the ion source chamber 114, and $P_2$ is the partial pressure of the same dopant species within the interior region 138.

Upon a change from the gaseous first dopant species ($BF_3$) to the gaseous second dopant species ($PH_3$), the second dopant species is pumped into the ion source chamber 114. Accordingly, the partial pressure $P_2$ of the first dopant species within the ion source chamber 114 is quite large, due, at least in part, to the deposited n-type material 146 that is subsequently sputtered from the internal surfaces 134 of the ion source chamber by the second dopant species. Upon diffusing from the ion source chamber 114, the sputtered first dopant species can then collide with the wall 142 in the diffusion region 140, wherein the sputtered first dopant species generally sticks (e.g., deposits) to the surface 144 of the wall. Furthermore, the partial pressure $P_1$ of the first dopant species within the diffusion region 140 is almost zero, due, at least in part, to both the deposition mentioned above, and vacuum produced by the pump 148, thus further facilitating the diffusion of the first dopant species from the ion source chamber 114.

Therefore, the throughput S (e.g., speed of evacuation) of the first dopant species is generally proportional to the fluid conductance C, which is further associated with the area (not shown) of the one or more diffusion apertures 136. Accordingly, the throughput S of the first dopant species can be significantly increased by providing appropriate diffusion apertures 136, such that the first dopant species can be readily removed from the ion source chamber 114.

It should be noted that the increase in conductance C realized by providing the one or more diffusion apertures 136 may also result in an increase in the throughput S of the second dopant species during subsequent ion implantations. Such an increase is generally considered minor compared to the advantageous decrease in transition time. Furthermore, since the partial pressure $P_2$ of the second dopant species is mainly due to the pump 148, the deposition of the second dopant species on the surface 144 is relatively small. If desired, however, one or more shutters 150 may be further provided, wherein the one or more shutters selectively cover or seal the one or more diffusion apertures 136 after the transition period is over. The one or more shutters 150 are therefore operable to provide an expeditious transition time, while minimizing gas flow losses through the one or more diffusion apertures 136 during subsequent ion implantations.

Figure 3:
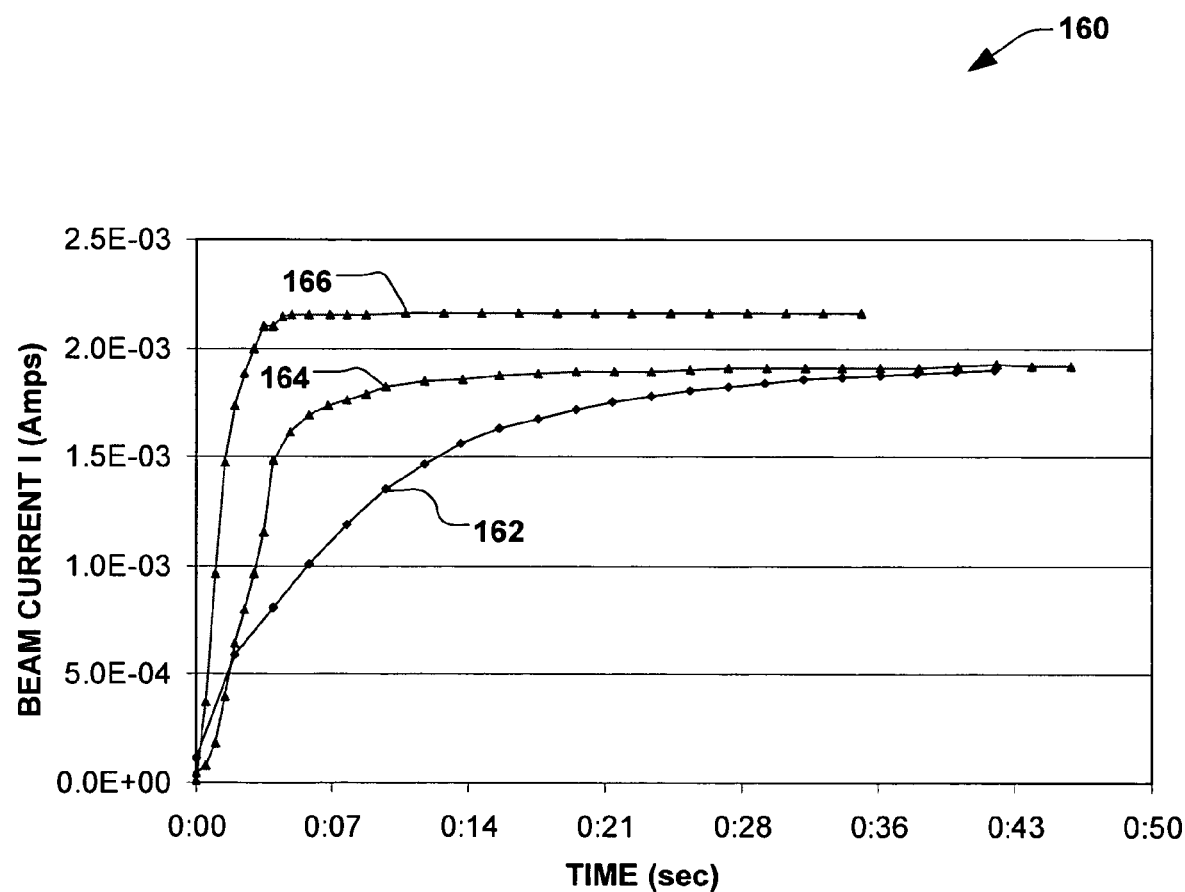
FIG. 3 is a graph of transition periods for several ion source chambers according to another aspect of the present invention.

FIG. 3 illustrates a graph 160 showing an exemplary decrease in transition times, wherein the transition time is generally determined by a measurement of ion beam current I for each particular scenario. For example, in a conventional ion source chamber (not shown) having an extraction slit 123 of FIG. 2 with a surface area of approximately 40 mm², but having no diffusion apertures 136, curve 162 illustrates the beam current I reaching a plateau at approximately 30 minutes after transitioning from the first dopant species to the second dopant species. Curve 164, on the other hand, illustrates a faster stabilization time of approximately 10 minutes for an ion source chamber 114 of the present invention having a single diffusion aperture 136 of approximately 100 mm² surface area, while curve 166 illustrates an even faster stabilization time of approximately 5 minutes for an ion source chamber 114 of the present invention having two diffusion apertures 136, wherein each diffusion aperture has approximately 100 mm² surface area (for a total of 200 mm²) of the internal surface 134 of the ion source chamber. Thus, providing an ion source chamber 114 comprising at least one diffusion aperture 136 provides a substantial decrease in transition time over conventional systems.

Figure 4:
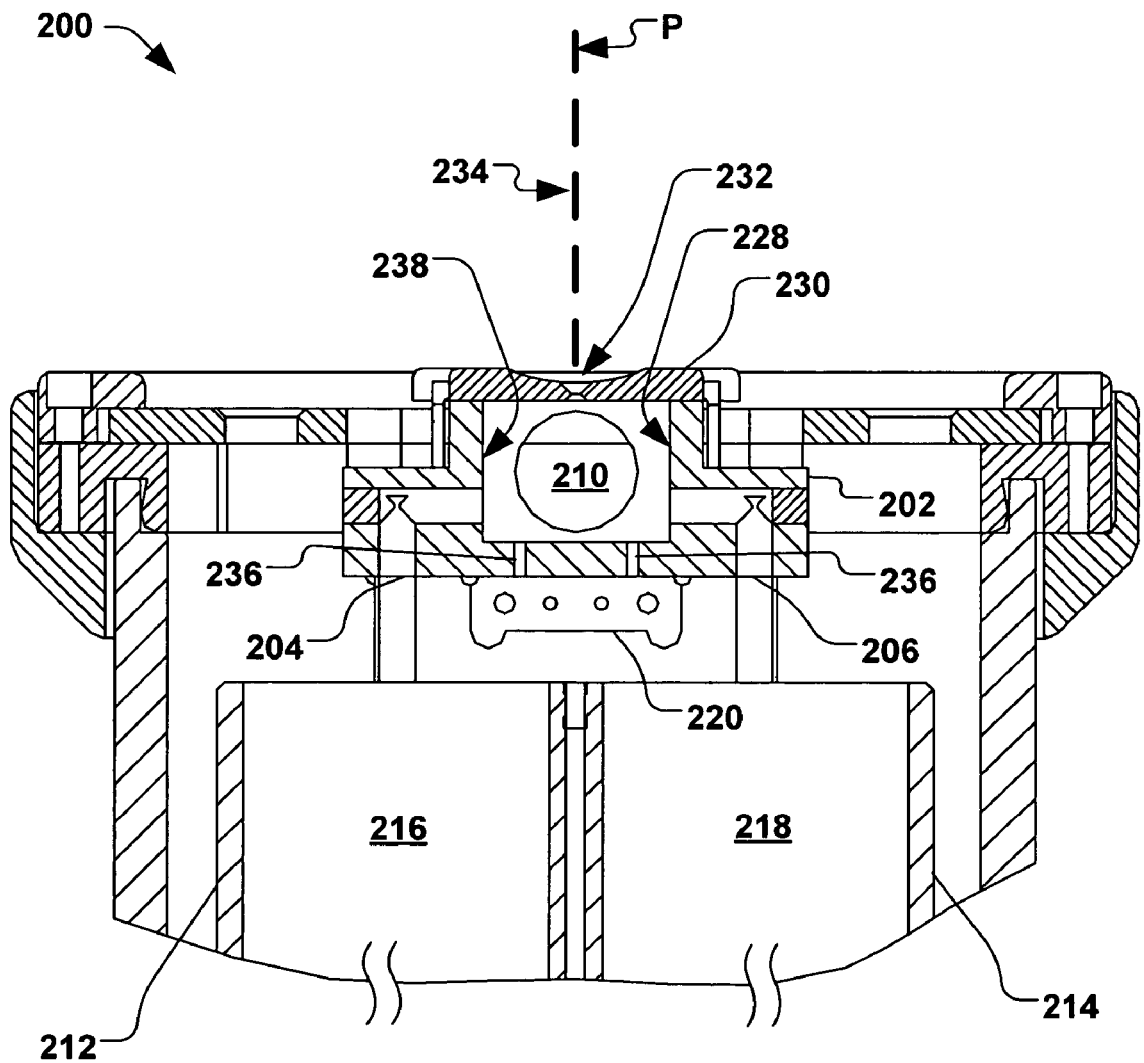
FIG. 4 illustrates a partial cross-sectional view of an exemplary ion source in accordance with yet another aspect of the present invention.

In accordance with another aspect of the present invention, FIG. 4 illustrates a more detailed partial cross-sectional view of an exemplary ion source assembly 200, such as the ion source assembly 106 associated with the ion implantation apparatus 102 of FIG. 1. The ion source assembly 200 of FIG. 4, for example, comprises an ion source chamber 202 (e.g., a plasma chamber or arc chamber), wherein the ion source chamber is operable to form a plurality of ions (not shown) therein. In accordance with one exemplary aspect of the present invention, the ion source chamber 202 comprises a first inlet 204 and a second inlet 206, wherein the first inlet and second inlet are operable to introduce a selected dopant material (not shown) to an interior region 210 of the ion source chamber. For example, the first inlet 204 and second inlet 206 generally provide a selective fluid communication between the interior region 210 of the ion source chamber 202 and a respective first ignitable material source 212 and a second ignitable material source 214. The first ignitable material source 212 and second ignitable material source 214, for example, comprise the respective first and second process species sources 116 and 118 of FIG. 1, and can be coupled to the respective first inlet 204 and second inlet 206 via any suitable fluid network. It should be noted that a single combined inlet (not shown) can be alternatively substituted for the first inlet 204 and second inlet 206, and that any number of inlets are contemplated as falling within the scope of the present invention.

The first ignitable material source 212 and a second ignitable material source 214 of FIG. 4 are operable to provide the selected dopant material (e.g., a respective first ignitable material 216 and a second ignitable material 218) to the ion source chamber 202, depending on the desired type of ion implantation. For example, the first ignitable material 216 can comprise an n-type source material comprising boron, gallium or indium, such as boron trifluoride, and the second ignitable material can comprise a p-type source material comprising phosphorus, arsenic, or antimony, such as phosphorus pentafluoride. The first ignitable material 216 and/or second ignitable materials 218 may be in the form of a gas or a solid. In the case of a solid source material, the respective first ignitable material source 212 and/or second ignitable material source 214 may further comprise an oven (not shown) operable to heat or vaporize the respective first ignitable material 216 and/or second ignitable material 218 prior to introduction to the interior region 210 of the ion source chamber.

The ion source assembly 200 can further comprise an exciter 220, such as an energizing electrode, RF antenna, or other element that is operable to ionize the respective first ignitable material 216 and second ignitable material 218. Upon an application of power to the first ignitable material 216 or the second ignitable material 218 within the ion source chamber 202 via the exciter 220 (e.g., from the power source 120 of FIG. 1), a plasma can be formed from the respective first ignitable material or second ignitable material within the interior region 210. The ion source assembly 200 can further comprise a plasma electrode 224 at an opposite end of the exciter 220 for allowing ions from the plasma to exit the ion source chamber 202.

For example, the ion source chamber 202 comprises a housing 226 having one or more sidewalls 228 and an extraction plate 230, wherein the one or more sidewalls and extraction plate generally enclose the interior region 210 of the ion source chamber. The housing 226 can be of various forms, such as a parallelepiped or a cup. The extraction plate 230 further comprises an extraction aperture 232 (also called an extraction slit) associated therewith, wherein the ions generally exit the interior region 210 of the ion source chamber 202 and form an ion beam 234. The extraction plate 230, for example, can be integral to the housing 226, or alternatively, the extraction plate can be removable from the housing. The ion source assembly 200 may further comprise an extraction electrode (not shown) associated with the extraction aperture 220, wherein the extraction electrode is operable to further extract ions from the interior region 210 of the ion source chamber 202 in order to generally from the ion beam 234.

Figure 5A:
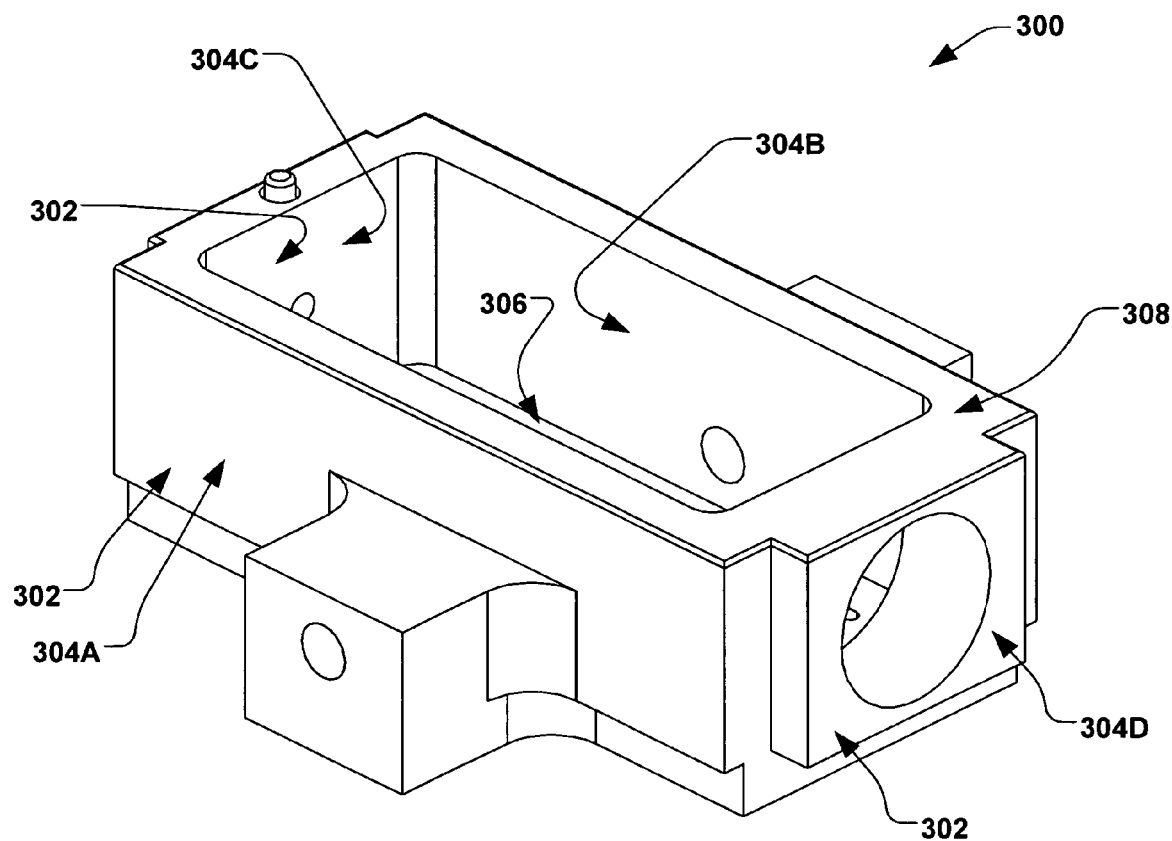
FIGS. 5A-5B illustrate various perspective views of another exemplary ion source chamber according to still another aspect of the present invention.
Figure 5B:
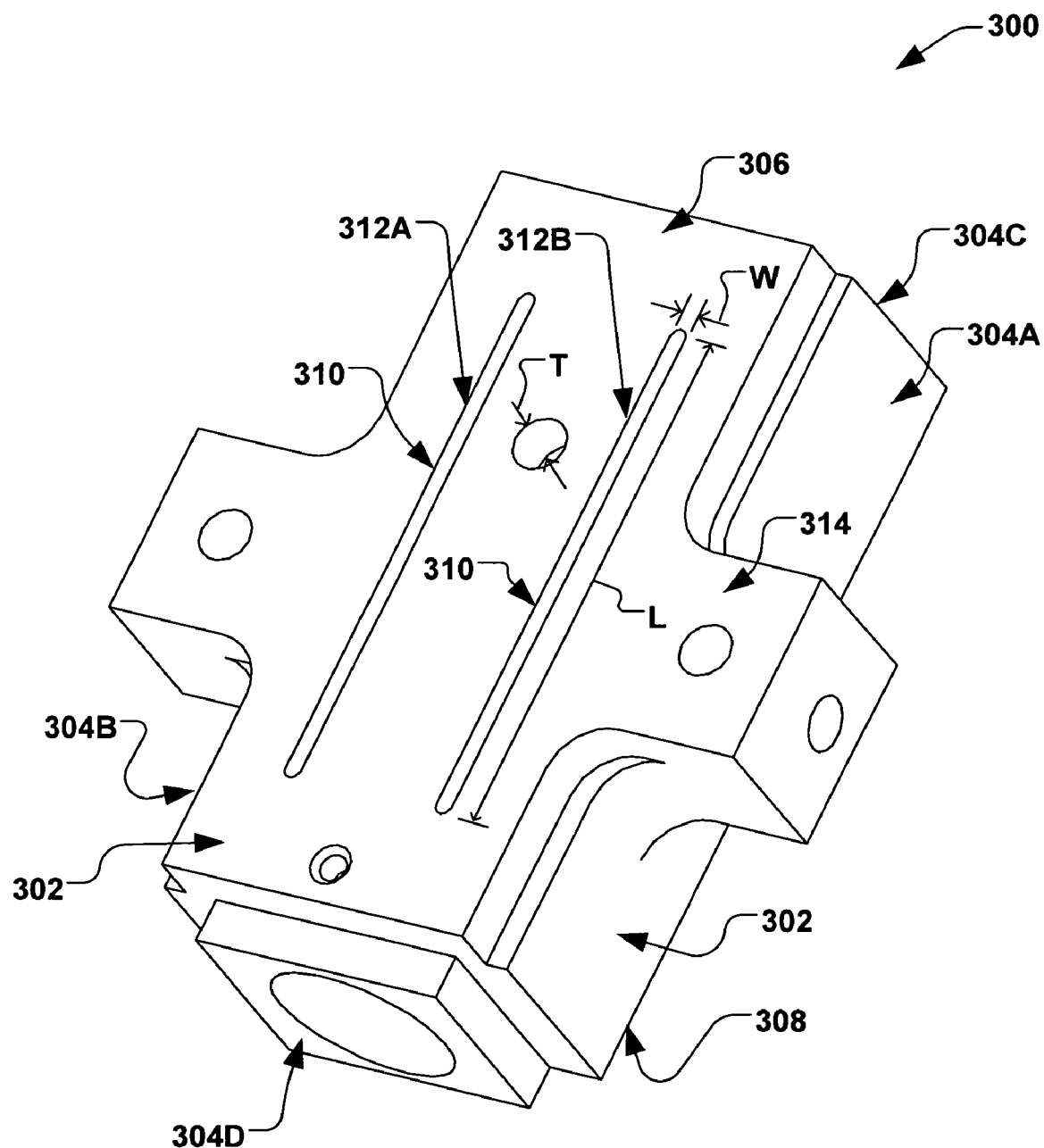

Referring now to FIGS. 5A and 5B, an exemplary housing 300 associated with the ion source chamber 202 of FIG. 4 is illustrated in greater detail in various perspective views. The housing 300 of FIGS. 5A and 5B, for example, generally comprises one or more sidewalls 302, wherein the housing in the present example generally takes the form of a cup. The one or more sidewalls 302 generally comprise adjacent sidewalls 304A-304D and a posterior sidewall 306, wherein the extraction plate 230 of FIG. 4, for example, is generally positioned on an open end 308 of the housing 300 of FIG. 5A, therein generally enclosing the interior region 210 of the ion source chamber 202. Accordingly, the extraction plate 230 of FIG. 4 is generally diametrically opposed to the posterior sidewall 306 of FIGS. 4A and 4B, however, the extraction plate is not illustrated in FIGS. 5A and 5B for purposes of clarity. In FIG. 5B, for example, the posterior sidewall 306 is illustrated comprising one or more diffusion apertures 310. It should be noted that the one or more diffusion apertures 310, while presently described as being associated with the posterior sidewall 306, can be alternatively or additionally associated with one or more of the adjacent sidewalls 304A-304D, and all such configurations are contemplated as falling within the scope of the present invention.

As illustrated in FIG. 5B, the one or more diffusion apertures 310 comprise one or more elongate slots 312A and 312B in the posterior sidewall 306 of the housing, wherein the one or more elongate slots are generally defined by a length L and a width W along a plane 314 of the posterior sidewall. In the present example, the one or more elongate slots 312A and 312B are generally linear with respect to the plane 314 of the sidewall posterior sidewall 306, however, a shape of the one or more diffusion apertures 310 can take any shape, such as an elongate curvilinear slot (not shown), a generally circular hole (not shown), or the like, and all such shapes of the one or more diffusion apertures are contemplated as falling within the scope of the present invention.

According to another aspect of the invention, the one or more diffusion apertures 310 are further defined by a thickness T of the sidewall 302 in which they are defined. In one example, the width W each diffusion aperture 310 (e.g., the width W of the one or more elongate slots 312A and 312B) is generally less than the thickness T of the respective sidewall 302 (e.g., the thickness T of the posterior sidewall 306). Providing a width W of each diffusion aperture 310 as being less than the thickness T of the respective sidewall 302 advantageously limits the amount of flow (conductance) of the particular dopant species of FIGS. 1 and 4 through each diffusion aperture, wherein a combination of the width W, thickness T, and length L of the one or more diffusion apertures are selected such that an optimal amount of dopant species is diffused through the one or more diffusion apertures. The optimal amount of diffusion, for example, can be determined by experiment in order to achieve a desired transition time. A ratio of width W to thickness T is generally less than 1:1, and in one example, an optimal ratio may be approximately 1:3. Such a ratio, for example, generally limits the diffusion of the second dopant species through the one or more slots 312. In another example, the total area of the slots can be further determined by experiment in order to achieve the desired transition time.

Figure 6:
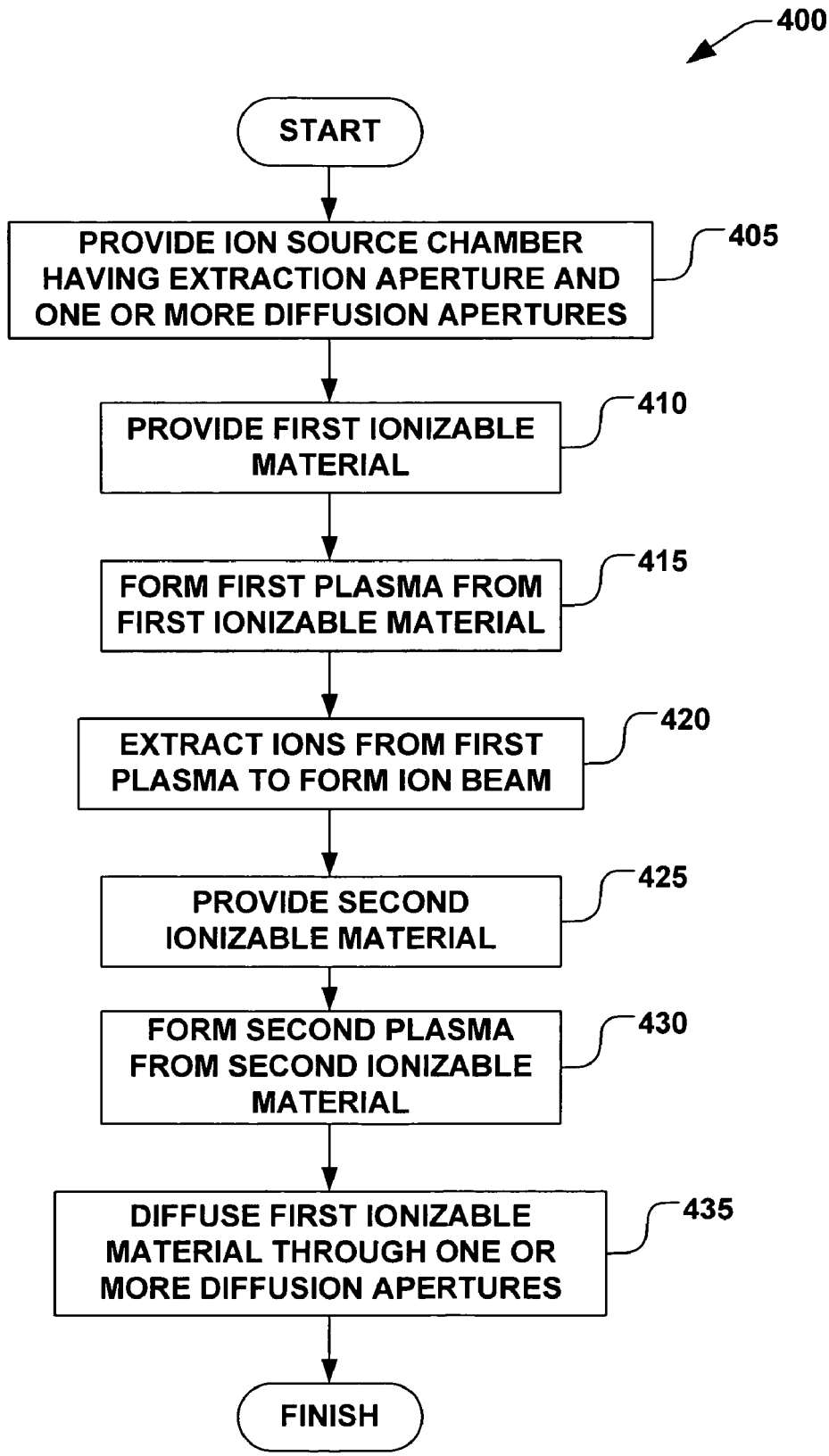
FIG. 6 is a block diagram of an exemplary method for changing source materials in an ion implantation system according to another exemplary aspect of the invention.

In accordance with another aspect of the present invention, FIG. 6 illustrates a method 400 for changing source gases in an ion implantation system. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 6, the method 400 begins with providing an ion source chamber in act 405, wherein the ion source chamber comprises an extraction aperture and one or more diffusion apertures associated therewith. The ion source chamber, for example, can be utilized in an ion implantation system, such as the ion implantation system 100 of FIG. 1. In act 410 of FIG. 6, a first ignitable material is provided to the ion source chamber, such as an ignitable gas or solid. In act 415, a first plasma is formed within the ion source chamber, wherein the first ignitable material is generally ionized. Ions associated with the first ignitable material, for example, are generally extracted through the extraction aperture, and are further generally deposited onto one or more interior surfaces of the ion chamber in act 420.

In act 425, a second ignitable material is provided to the ion source chamber. For example, a supply of the first ignitable source material is halted, and the second ignitable source material is generally provided within the ion source chamber. A second plasma is then formed from the second ignitable material in act 430, wherein ions from the second ignitable material are generally extracted through the extraction aperture, while also sputtering the interior surface(s) of the ion source chamber. Accordingly, the ions of the first ignitable material sputtered by the second ignitable source material generally dislodge from the interior surface(s) of the ion source chamber. In act 435, the first ignitable material is then diffused through the one or more diffusion apertures associated with the ion source chamber, thus efficiently transitioning the ion source chamber from the first ignitable material to the second ignitable material.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An ion source chamber for an ion implantation system, the ion source chamber comprising:
a housing having one or more sidewalls;
an extraction plate associated with the housing, wherein the one or more sidewalls and the extraction plate generally enclose an interior region of the ion source chamber;
one or more inlets associated with the housing, wherein the one or more inlets provide a fluid communication between one or more ionizable material sources and the interior region of the ion source chamber;
an extraction aperture associated with the extraction plate, wherein the extraction aperture provides a fluid communication between the interior region of the ion source chamber and a beam path region external to the ion source chamber; and
one or more diffusion apertures defined in the one or more sidewalls of the housing, wherein the one or more diffusion apertures provide a fluid communication between the interior region of the ion source chamber and a diffusion region external to the ion source chamber.

2. An ion source chamber for an ion implantation system, the ion source chamber comprising:
a housing having one or more sidewalls;
an extraction plate associated with the housing, wherein the one or more sidewalls and the extraction plate generally enclose an interior region of the ion source chamber, and wherein one of the one or more sidewalls is diametrically opposed to the extraction plate, therein defining a posterior sidewall;
one or more inlets associated with the housing, wherein the one or more inlets provide a fluid communication between one or more ionizable material sources and the interior region of the ion source chamber;
an extraction aperture associated with the extraction plate, wherein the extraction aperture provides a fluid communication between the interior region of the ion source chamber and a beam oath region external to the ion source chamber; and
one or more diffusion apertures defined in the one or more sidewalls of the housing, wherein the one or more diffusion apertures provide a fluid communication between the interior region of the ion source chamber and a diffusion region external to the ion source chamber, and wherein the one or more diffusion apertures are associated with the posterior sidewall.

3. The ion source chamber of claim 2, wherein the one or more diffusion apertures comprise one or more elongate slots in one or more of the sidewalls of the housing, wherein the one or more elongate slots are generally defined by a length and a width along a plane of the respective sidewall, and wherein the length of the one or more elongate slots is substantially larger than the width thereof.

4. The ion source chamber of claim 3, wherein the one or more elongate slots are generally curvilinear in shape.

5. The ion source chamber of claim 3, wherein the one or more elongate slots are further defined by a thickness of the one or more sidewalls, and wherein the width each of the one or more elongate slots is generally less than the thickness of the respective sidewall.

6. The ion source chamber of claim 5, wherein a ratio of the width of each of the one or more elongate slots to the thickness of the one or more sidewalls is approximately 1:3.

7. The ion source chamber of claim 3, wherein the length and width of each elongate slot generally defines an area of each elongate slot, and wherein a total of the areas of each elongate slot is generally larger than an area of the extraction aperture.

8. An ion source chamber for an ion implantation system, the ion source chamber comprising:
   a housing having one or more sidewalls;
   an extraction plate associated with the housing, wherein the one or more sidewalls and the extraction plate generally enclose an interior region of the ion source chamber, and wherein at least one of the one or more sidewalls is adjacent to the extraction plate, therein defining at least one adjacent sidewall;
   one or more inlets associated with the housing, wherein the one or more inlets provide a fluid communication between one or more ionizable material sources and the interior region of the ion source chamber;
   an extraction aperture associated with the extraction plate, wherein the extraction aperture provides a fluid communication between the interior region of the ion source chamber and a beam oath region external to the ion source chamber; and
   one or more diffusion apertures defined in the one or more sidewalls of the housing, wherein the one or more diffusion apertures provide a fluid communication between the interior region of the ion source chamber and a diffusion region external to the ion source chamber, and wherein the one or more diffusion apertures are associated with the at least one adjacent sidewall.

9. The ion source chamber of claim 2, further comprising an extraction apparatus associated with the extraction aperture, wherein the extraction apparatus is operable to extract ions from the interior region of the ion source chamber through the extraction aperture to generally form an ion beam associated with the beam path region.

10. The ion source chamber of claim 2, further comprising one or more shutters associated with the one or more diffusion apertures, wherein the one or more shutters are operable to selectively seal the one or more diffusion apertures, therein generally limiting the fluid communication between the interior region of the ion source chamber and the diffusion region.

11. The ion source chamber of claim 2, further comprising an excitation source, wherein the excitation source is operable to form a plasma from one or more ionizable materials provided from the one or more ionizable material sources within the interior region of the ion source chamber.

12. A method for changing source materials in an ion implantation system, the method comprising:
   providing an ion source chamber having an extraction aperture and one or more diffusion apertures;
   providing a first ionizable material to the ion source chamber;
   forming a first plasma from the first ionizable material, wherein ions from the first ionizable material are both extracted through the extraction aperture and deposited onto an interior surface of the ion source chamber;
   providing a second ionizable material to the ion source chamber;
   forming a second plasma from the second ionizable material, wherein ions from the second ionizable material are both extracted through the extraction aperture and sputter the interior surface of the ion source chamber, therein dislodging the first ionizable material from the interior surface of the ion source chamber; and
   diffusing the first ionizable material that has been dislodged from the interior surface of the ion source chamber through the extraction aperture and the one or more diffusion apertures.

13. The method of claim 12, wherein the first ionizable material comprises boron or phosphorus.

14. The method of claim 13, wherein the first ionizable material comprises boron trifluoride.

15. The method of claim 13, wherein the second ionizable material comprises boron or phosphorus.

16. The method of claim 15, wherein second ionizable material comprises phosphine.

17. The ion source chamber of claim 8, wherein the one or more diffusion apertures comprise one or more elongate slots in one or more of the sidewalls of the housing, wherein the one or more elongate slots are generally defined by a length and a width along a plane of the respective sidewall, and wherein the length of the one or more elongate slots is substantially larger than the width thereof.

18. The ion source chamber of claim 17, wherein the one or more elongate slots are generally curvilinear in shape.

19. The ion source chamber of claim 17, wherein the one or more elongate slots are further defined by a thickness of the one or more sidewalls, and wherein the width each of the one or more elongate slots is generally less than the thickness of the respective sidewall.

20. The ion source chamber of claim 19, wherein a ratio of the width of each of the one or more elongate slots to the thickness of the one or more sidewalls is approximately 1:3.

21. The ion source chamber of claim 17, wherein the length and width of each elongate slot generally defines an area of each elongate slot, and wherein a total of the areas of each elongate slot is generally larger than an area of the extraction aperture.

22. The ion source chamber of claim 8, further comprising an extraction apparatus associated with the extraction aperture, wherein the extraction apparatus is operable to extract ions from the interior region of the ion source chamber through the extraction aperture to generally form an ion beam associated with the beam path region.

23. The ion source chamber of claim 8, further comprising one or more shutters associated with the one or more diffusion apertures, wherein the one or more shutters are operable to selectively seal the one or more diffusion apertures, therein generally limiting the fluid communication between the interior region of the ion source chamber and the diffusion region.

24. The ion source chamber of claim 8, further comprising an excitation source, wherein the excitation source is operable to form a plasma from one or more ionizable materials provided from the one or more ionizable material sources within the interior region of the ion source chamber.

* * * * *

UNITED STATES PATENT AND TRADEMARK OFFICE
CERTIFICATE OF CORRECTION

PATENT NO. : 7,488,958 B2 Page 1 of 1
APPLICATION NO. : 11/074435
DATED : February 10, 2009
INVENTOR(S) : Yongzhang Huang It is certified that error appears in the above-identified patent and that said Letters Patent is hereby corrected as shown below:

Column 10, claim 2, line 50; please replace "oath" with --path--
Column 11, claim 8, line 27; please replace "plate." with --plate,--
Column 11, claim 8, line 30; please replace "oath" with --path--

Signed and Sealed this

Twenty-fourth Day of March, 2009

JOHN DOLL
*Acting Director of the United States Patent and Trademark Office*